(12) United States Patent
Chae et al.

(10) Patent No.: US 11,146,075 B2
(45) Date of Patent: Oct. 12, 2021

(54) CHARGE/DISCHARGE CONTROL APPARATUS AND METHOD OF ENERGY STORAGE SYSTEM, AND ENERGY CHARGE/DISCHARGE CONTROL SYSTEM AND METHOD

(71) Applicant: Korea Institute of Energy Research, Daejeon (KR)

(72) Inventors: Su Yong Chae, Daejeon (KR); Sea Seung Oh, Daejeon (KR); Hak Geun Jeong, Daejeon (KR); Jong Bok Baek, Daejeon (KR); Soo Bin Han, Daejeon (KR); Suk In Park, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 85 days.

(21) Appl. No.: 16/597,236

(22) Filed: Oct. 9, 2019

(65) Prior Publication Data

US 2021/0104896 A1    Apr. 8, 2021

(30) Foreign Application Priority Data

Oct. 2, 2019    (KR) .................. 10-2019-0121998

(51) Int. Cl.
*H02J 7/00* (2006.01)
*G06F 17/11* (2006.01)
*G01R 31/382* (2019.01)

(52) U.S. Cl.
CPC ........ *H02J 7/00036* (2020.01); *G01R 31/382* (2019.01); *G06F 17/11* (2013.01); *H02J 7/00041* (2020.01)

(58) Field of Classification Search
CPC ...... H02J 7/00036; H02J 7/00041; H02J 7/00; G06F 17/11; G01R 31/382
See application file for complete search history.

(56) References Cited

U.S. PATENT DOCUMENTS

| 9,634,510 B2 | 4/2017 | Choi et al. | |
| 2014/0188300 A1* | 7/2014 | Nguyen | H02J 3/46 700/297 |

(Continued)

FOREIGN PATENT DOCUMENTS

| KR | 10-2016-0109273 A | 9/2016 |
| KR | 10-2017-0013772 A | 2/2017 |
| KR | 10-1785825 B1 | 10/2017 |

OTHER PUBLICATIONS

Kim et al., "Adaptive Droop Control Method for Multiple Energy Storage Systems in DC Distribution System," Power Electronics Conference, Jul. 2014, pp. 257-258 (4 pages total), with English translation.

*Primary Examiner* — Vuthe Siek
(74) *Attorney, Agent, or Firm* — Birch, Stewart, Kolasch & Birch, LLP

(57) ABSTRACT

One exemplary embodiment provides a charging and discharging control apparatus for an energy storage apparatus, the charging and discharging control apparatus including: a charging and discharging controlling unit configured to control a charging and discharging current amount of the energy storage apparatus according to a droop curve; a communication unit configured to receive state information from the energy storage apparatus; and a droop curve adjusting unit configured to adjust a characteristic value of the droop curve according to the state information.

16 Claims, 18 Drawing Sheets

(56) References Cited

U.S. PATENT DOCUMENTS

| | | | |
|---|---|---|---|
| 2015/0214754 A1* | 7/2015 | Choi | H02J 3/242 |
| | | | 320/134 |
| 2017/0214243 A1* | 7/2017 | Rancuret | H02J 3/38 |
| 2019/0181648 A1* | 6/2019 | Zhou | H02J 3/32 |

* cited by examiner

FIG. 17

| SOC | y-intercept adjustment value |
|---|---|
| 0.1 | 300V |
| 0.2 | 320V |
| 0.3 | 340V |
| 0.4 | 360V |
| 0.5 | 380V |
| 0.6 | 400V |
| 0.7 | 420V |
| 0.8 | 440V |

CHARGE/DISCHARGE CONTROL APPARATUS AND METHOD OF ENERGY STORAGE SYSTEM, AND ENERGY CHARGE/DISCHARGE CONTROL SYSTEM AND METHOD

CROSS REFERENCE TO RELATED APPLICATIONS

This non-provisional application claims the benefit under 35 U.S.C. § 119(a) to Patent Application No. 10-2019-0121998, filed in the Republic of Korea on Oct. 2, 2019, all of which is hereby expressly incorporated by reference into the present application.

BACKGROUND OF THE INVENTION

1. Field of the Invention

An exemplary embodiment relates to a charging and discharging control apparatus and a charging and discharging control method for an energy storage apparatus, an energy charging and discharging control system, and an energy charging and discharging control method.

2. Description of the Prior Art

Recently, with growing interest in environmental protection, smart grid businesses using an energy storage system (ESS) have received attention due to the widespread use of renewable energy and an increase in demand for power.

Energy storage systems capable of stably supplying and charging power are increasingly adopted and utilized in a wide range of industries including the field of renewable energy. Accordingly, the importance of technology for management systems for efficiently using and managing energy storage systems increases more and more.

Generally, the life of an energy storage system varies depending on the operation and control method of the energy storage system. In particular, over-charging and deep-discharging of an energy storage system shortens the life of the energy storage system and thus needs to be controlled considering the state of the energy storage system, that is, the charging state and the aging state of the energy storage system.

As a control method for controlling the charging and discharging of an energy storage system, there is droop control using a droop curve.

According to a conventional droop control method, characteristic values that determine the characteristics of a droop curve (e.g., the y-intercept value and the slope value of the droop curve) are fixedly set when an energy storage system is initially released.

Therefore, in conventional droop control, since the state of an energy storage system that can be changed during the operation of the energy storage system is not taken into consideration, over-charging and deep-discharging may occur only in an energy storage system having a different state in parallel operations of a plurality of energy storage systems.

SUMMARY OF THE INVENTION

With this background, an aspect of exemplary embodiments is to provide a charging and discharging control apparatus and a charging and discharging control method for adjusting a characteristic value of a droop curve for controlling the charging and discharging of an energy storage apparatus according to the state of the energy storage apparatus, and an energy charging and discharging control system and an energy charging and discharging control method that include the charging and discharging control apparatus.

In view of the foregoing, one exemplary embodiment provides a charging and discharging control apparatus for an energy storage apparatus, the charging and discharging control apparatus including: a charging and discharging controlling unit configured to control a charging and discharging current amount of the energy storage apparatus according to a droop curve; a communication unit configured to receive state information from the energy storage apparatus; and a droop curve adjusting unit configured to adjust a characteristic value of the droop curve according to the state information.

The characteristic value may be a y-intercept value of a droop function expressing the droop curve in an equation, and the droop curve adjusting unit may adjust the characteristic value with a value obtained by putting the state information of the energy storage apparatus into a y-intercept value adjustment function, in which the state information of the energy storage apparatus is used as an independent variable and a y-intercept adjustment value is used as a dependent variable.

The state information may include one or more of state-of-charging (SOC) information, state-of-health (SOH) information, and apparatus temperature information of the energy storage apparatus.

The droop curve adjusting unit may calculate a slope value of the y-intercept value adjustment function by putting the SOH information into a slope value calculation function for calculating the slope value and may adjust the characteristic value by putting the slope value and the SOC information into the y-intercept value adjustment function.

The characteristic value may be a y-intercept value of a droop function expressing the droop curve in an equation, and the droop curve adjusting unit may adjust the characteristic value to a y-intercept adjustment value corresponding to the state information from a y-intercept value adjustment lookup table, wherein the y-intercept adjustment value is an adjusted value of the y-intercept value according to a state of the energy storage apparatus.

The state information may include SOC information of the energy storage apparatus, and the y-intercept value adjustment function may be a nonlinear function that has a gentle slope of a tangent in an x-axis range where the SOC information is a predetermined threshold or above and has a sharp slope of a tangent in an x-axis range where the SOC information is the predetermined threshold or below.

The state information may include SOC information and SOH information of the energy storage apparatus, and the y-intercept value adjustment function may be a three-dimensional function using the SOC information and the SOH information as independent variables.

The state information may include apparatus temperature information of the energy storage apparatus, and the y-intercept value adjustment function may be a nonlinear function that sets a predetermined temperature as a peak point and has the y-intercept adjustment value maximized when the apparatus temperature information is the predetermined temperature.

Another exemplary embodiment provides a charging and discharging control method for an energy storage apparatus, the charging and discharging control method including: an information reception operation in which a charging and discharging control apparatus, configured to control a charging and discharging current amount of the energy storage apparatus according to a droop curve, receives one or more of SOC information, SOH information, and apparatus temperature information from the energy storage apparatus; a characteristic value adjustment operation of adjusting a characteristic value of the droop curve using one or more of the SOC information, the SOH information, and the apparatus temperature information; and a droop control operation of controlling the charging and discharging current amount of the energy storage apparatus according to the droop curve having the adjusted characteristic value.

The characteristic value may be a y-intercept value of a droop function expressing the droop curve in an equation.

In the characteristic value adjustment operation, the charging and discharging control apparatus may adjust the characteristic value with a value obtained by putting any one of the SOC information, the SOH information, and the apparatus temperature information into a y-intercept value adjustment function, in which the SOC information, the SOH information, and the apparatus temperature information are used as an independent variable and a y-intercept adjustment value is used as a dependent variable, wherein the y-intercept adjustment value is an adjusted value of the y-intercept value according to a state of the energy storage apparatus.

In the characteristic value adjustment operation, the charging and discharging control apparatus may adjust the characteristic value with a value obtained by putting the SOC information and the SOH information into a y-intercept value adjustment function, in which the SOC information is used as a first independent variable, the SOH information is used as a second independent variable, and a y-intercept adjustment value is used as a dependent variable, wherein the y-intercept value is an adjusted value of the y-intercept value according to a state of the energy storage apparatus.

The characteristic value adjustment operation may comprise steps of: calculating a slope value of the y-intercept value adjustment function by putting the SOH information into a slope value calculation function for calculating the slope value; and adjusting the characteristic value by putting the slope value and the SOC information into the y-intercept value adjustment function.

Still another exemplary embodiment provides an energy charging and discharging control system including: a first energy storage apparatus, comprising a first battery cell group having a first charging and discharging capacity, configured to measure first state information, which relates to a charging and discharging state of the first battery cell group; a first charging and discharging control apparatus, which controls a charging and discharging current amount of the first energy storage apparatus according to a first droop curve, configured to receive the first state information from the first energy storage apparatus, and to adjust a first characteristic value, which is a characteristic value of the first droop curve, according to the first state information; a second energy storage apparatus, comprising a second battery cell group having a second charging and discharging capacity, configured to measure second state information, which relates to a charging and discharging state of the second battery cell group; and a second charging and discharging control apparatus, which controls a charging and discharging current amount of the second energy storage apparatus according to a second droop curve, configured to receive the second state information from the second energy storage apparatus, and to adjust a second characteristic value, which is a characteristic value of the second droop curve, according to the second state information.

The first characteristic value may be a first y-intercept value, which is a y-intercept value of a first droop function expressing the first droop curve in an equation, and the first charging and discharging control apparatus may adjust the first characteristic value with a value obtained by putting the first state information into a first y-intercept value adjustment function, in which the first state information is used as an independent variable and a first y-intercept adjustment value is used as a dependent variable, wherein the first y-intercept adjustment value is an adjusted value of the first y-intercept value according to a state of the first energy storage apparatus.

The second characteristic value may be a second y-intercept value, which is a y-intercept value of a second droop function expressing the second droop curve in an equation, and the second charging and discharging control apparatus may adjust the second characteristic value with a value obtained by putting the second state information into a second y-intercept value adjustment function, in which the second state information is used as an independent variable and a second y-intercept adjustment value is used as a dependent variable, wherein the second y-intercept adjustment value is an adjusted value of the second y-intercept value according to a state of the second energy storage apparatus.

When the first charging and discharging capacity and the second charging and discharging capacity are different, a slope value of the first y-intercept value adjustment function and a slope value of the second y-intercept value adjustment function may be different.

Yet another exemplary embodiment provides an energy charging and discharging control method including: a first information reception operation in which a first charging and discharging control apparatus, configured to control a charging and discharging current amount of a first energy storage apparatus according to a first droop curve, receives one or more of first SOC information, first SOH information, and first apparatus temperature information from the first energy storage apparatus; a first characteristic value adjustment operation of adjusting a first characteristic value, which is a characteristic value of the first droop curve, using one or more of the first SOC information, the first SOH information, and the first apparatus temperature information; a first droop control operation of controlling the charging and discharging current amount of the first energy storage apparatus according to the first droop curve having the adjusted first characteristic value; a second information reception operation in which a second charging and discharging control apparatus, configured to control a charging and discharging current amount of a second energy storage apparatus according to a second droop curve, receives one or more of second SOC information, second SOH information, and second apparatus temperature information from the second energy storage apparatus; a second characteristic value adjustment operation of adjusting a second characteristic value, which is a characteristic value of the second droop curve, using one or more of the second SOC information, the second SOH information, and the second apparatus temperature information; and a second droop control operation of controlling the charging and discharging current amount of the second energy storage apparatus according to the second droop curve having the adjusted second characteristic value.

As described above, according to one exemplary embodiment, a charging and discharging control apparatus may adjust a characteristic value of a droop curve in view of the current state of an energy storage apparatus and may perform droop control for the charging and discharging current amount accordingly, making it possible to appropriately share the charging and discharging current amount in parallel operations of a plurality of energy storage apparatuses according to the states of the energy storage apparatuses.

BRIEF DESCRIPTION OF THE DRAWINGS

The above and other aspects, features and advantages of the present disclosure will be more apparent from the following detailed description taken in conjunction with the accompanying drawings, in which:

FIG. 17 illustrates a y-intercept value adjustment lookup table according to an exemplary embodiment.

DETAILED DESCRIPTION OF THE EXEMPLARY EMBODIMENTS

Figure 1:
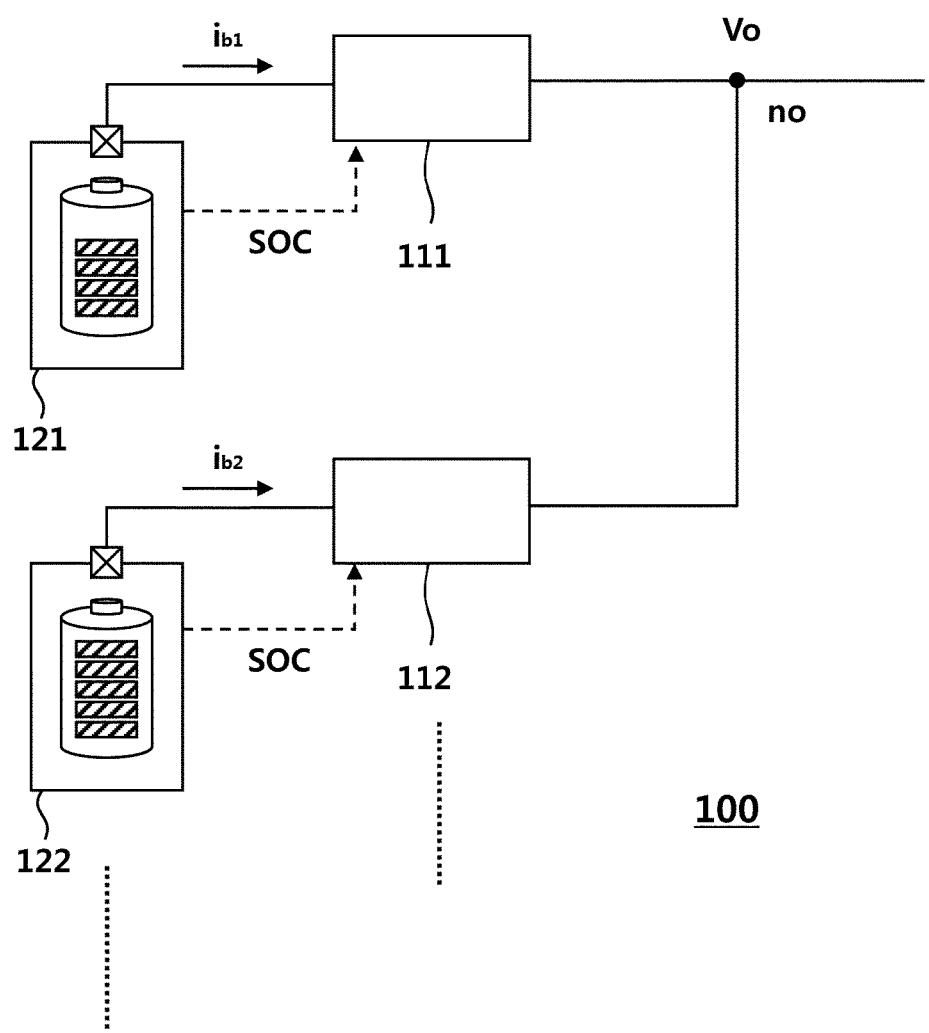
FIG. 1 to FIG. 4 are block diagrams illustrating an energy charging and discharging control system according to an exemplary embodiment.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 to FIG. 4 are block diagrams illustrating an energy charging and discharging control system according to an exemplary embodiment.

Referring to FIG. 1 to FIG. 4, the energy charging and discharging control system 100 may include a first charging and discharging control apparatus 111, a second charging and discharging control apparatus 112, a first energy storage apparatus 121, and a second energy storage apparatus 122.

The first charging and discharging control apparatus 111 is a device that controls the charging and discharging current amount $i_{b1}$ of the first energy storage apparatus 121 according to the output voltage $V_O$ of an output node no.

The first charging and discharging control apparatus 111 may control the charging and discharging current amount $i_{b1}$ of the first energy storage apparatus 121 through droop control.

That is, the first charging and discharging control apparatus 111 may control the charging and discharging current amount $i_{b1}$ of the first energy storage apparatus 121 according to a first droop curve, in which the first charging and discharging control apparatus 111 may receive first state information from the first energy storage apparatus 121 and may adjust a first characteristic value, which is the characteristic value of the first droop curve, according to the first state information. Here, the first characteristic value may be a first y-intercept value, which is the y-intercept value of a first droop function expressing the first droop curve (solid line in FIG. 8) in an equation. The first state information indicating the state of the first energy storage apparatus 121 may include one or more of first state-of-charging (SOC) information, which is SOC information about the first energy storage apparatus 121, first state-of-health (SOH) information, which is SOH information about the first energy storage apparatus 121, and first apparatus temperature information, which is internal temperature information about the first energy storage apparatus 121.

In one exemplary embodiment, the first droop curve and the first characteristic value may be default set values stored in the first charging and discharging control apparatus 111 when the first charging and discharging control apparatus 111 is manufactured. That is, the first y-intercept value, an independent variable, and a slope value included in the first droop function may be default values set at the time of manufacturing the first charging and discharging control apparatus 111.

The first charging and discharging control apparatus 111 may store a first y-intercept value adjustment function using a first y-intercept adjustment value as a dependent variable in order to adjust the first y-intercept value, which is the first characteristic value. Here, the first y-intercept adjustment value may refer to an adjusted value of the first y-intercept value according to the state of the first energy storage apparatus 121.

The first charging and discharging control apparatus 111 may calculate the first y-intercept adjustment value by putting the first state information into an independent variable in the first y-intercept value adjustment function and may adjust the first droop curve according to the first y-intercept adjustment value.

That is, the first charging and discharging control apparatus 111 may adjust the first characteristic value by putting the first state information into the independent variable in the first y-intercept value adjustment function. Further, the first charging and discharging control apparatus 111 may adjust the first droop curve according to the adjusted first characteristic value and may control the charging and discharging current amount $i_{b1}$ of the first energy storage apparatus 121 using the adjusted first droop curve (dotted line in FIG. 8).

Figure 8:
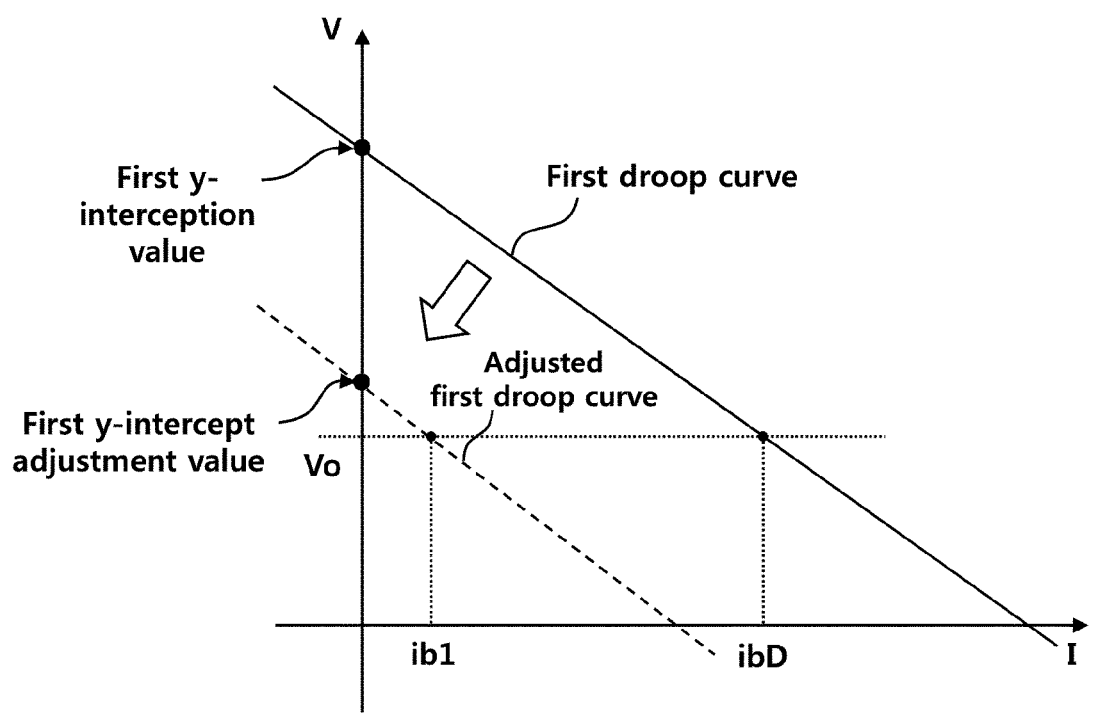
FIG. 8 and FIG. 9 illustrate a configuration for adjusting a characteristic value of a droop curve depending on the state of an energy storage apparatus according to an exemplary embodiment.

As illustrated in FIG. 8, when the first y-intercept adjustment value is smaller than the first y-intercept value, the first droop curve, which is a default set value, is also adjusted to be lower.

Accordingly, the first charging and discharging control apparatus 111 may calculate a smaller charging and discharging current amount $i_{b1}$ than the charging and discharging current amount $i_{bD}$ calculated using the first droop curve, which is the default set value.

That is, the first charging and discharging control apparatus 111 may change the charging and discharging current amount of the first energy storage apparatus 121 according to the state of the first energy storage apparatus 121.

Hereinafter, an exemplary embodiment in which the first charging and discharging control apparatus 111 adjusts the first characteristic value by putting the first state information into the independent variable in the first y-intercept value adjustment function will be described in detail.

In one exemplary embodiment, as illustrated in FIG. 1, the first charging and discharging control apparatus 111 may adjust the first characteristic value using the first SOC information as the first state information.

Specifically, the first charging and discharging control apparatus 111 may adjust the first characteristic value, that is, may calculate the first y-intercept adjustment value, by putting the first SOC information into the independent variable in the first y-intercept value adjustment function.

Figure 11:
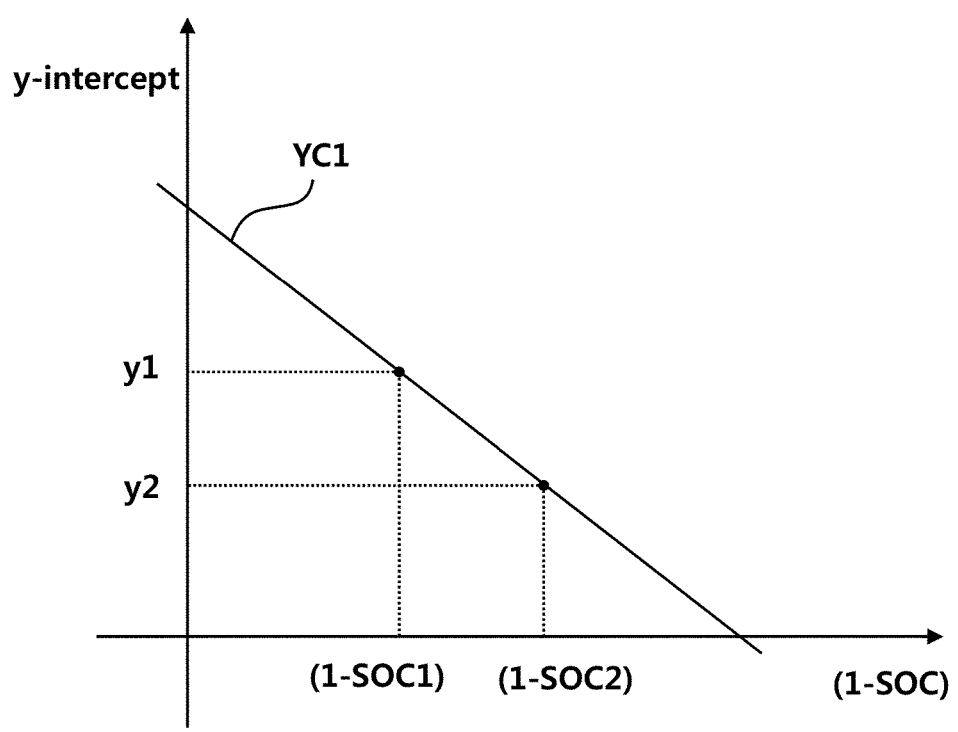
FIG. 11 to FIG. 16 illustrate a y-intercept value adjustment function according to an exemplary embodiment.

Here, the first y-intercept value adjustment function may be a linear function represented by a linear curve YC1 having a negative slope value as illustrated in FIG. 11.

The first charging and discharging control apparatus 111 may calculate the first y-intercept adjustment value using a value of a constant of 1 minus the first SOC information as an independent variable in the first y-intercept value adjustment function that is the linear function.

When the first y-intercept value adjustment function is the linear function, the first SOC information and the first y-intercept adjustment value may be proportional to each other.

For example, when the first SOC information is SOC1, the first y-intercept adjustment value may be calculated to be y1; and when the first SOC information is SOC2 smaller than SOC1, the first y-intercept adjustment value may be calculated to be y2 smaller than y1.

Figure 12:
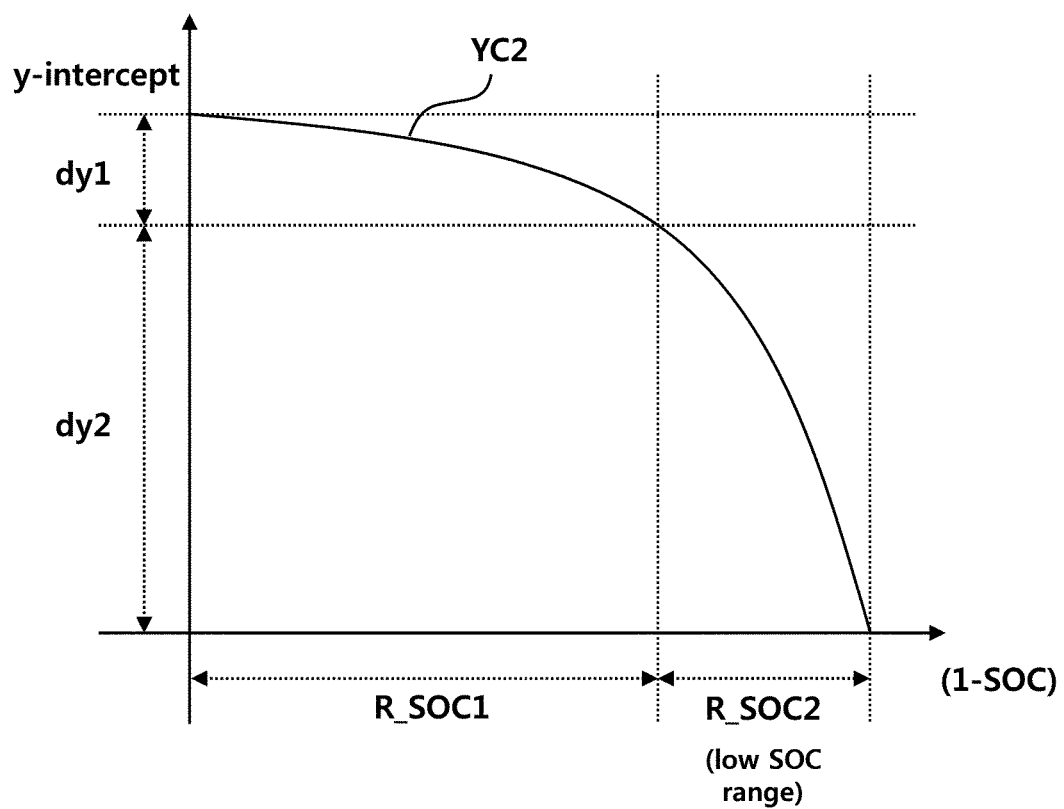

In one exemplary embodiment, as illustrated in FIG. 12, the first y-intercept value adjustment function may be a nonlinear function represented by a nonlinear curve YC2 that has a gentle slope of a tangent in an x-axis range where the first SOC information is a predetermined threshold or above and has a sharp slope of a tangent in an x-axis range where the first SOC information is below the predetermined threshold. Here, the predetermined threshold may be arbitrarily designated by the manufacturer of the first energy storage apparatus 121 or may be specified according to regulations.

The first charging and discharging control apparatus 111 may calculate the first y-intercept adjustment value using a value of a constant of 1 minus the first SOC information as an independent variable in the first y-intercept value adjustment function that is the nonlinear function.

That is, when a value (1-SOC) of a constant of 1 minus the first SOC information is in a range (R_SOC1) greater than the predetermined threshold, the first charging and discharging control apparatus 111 may calculate the first y-intercept adjustment value having a small difference from the existing first characteristic value; when a value (1-SOC) of a constant of 1 minus the first SOC information is in a range (R_SOC2) less than the predetermined threshold, the first charging and discharging control apparatus 111 may calculate the first y-intercept adjustment value having a huge difference from the first characteristic value.

Figure 2:
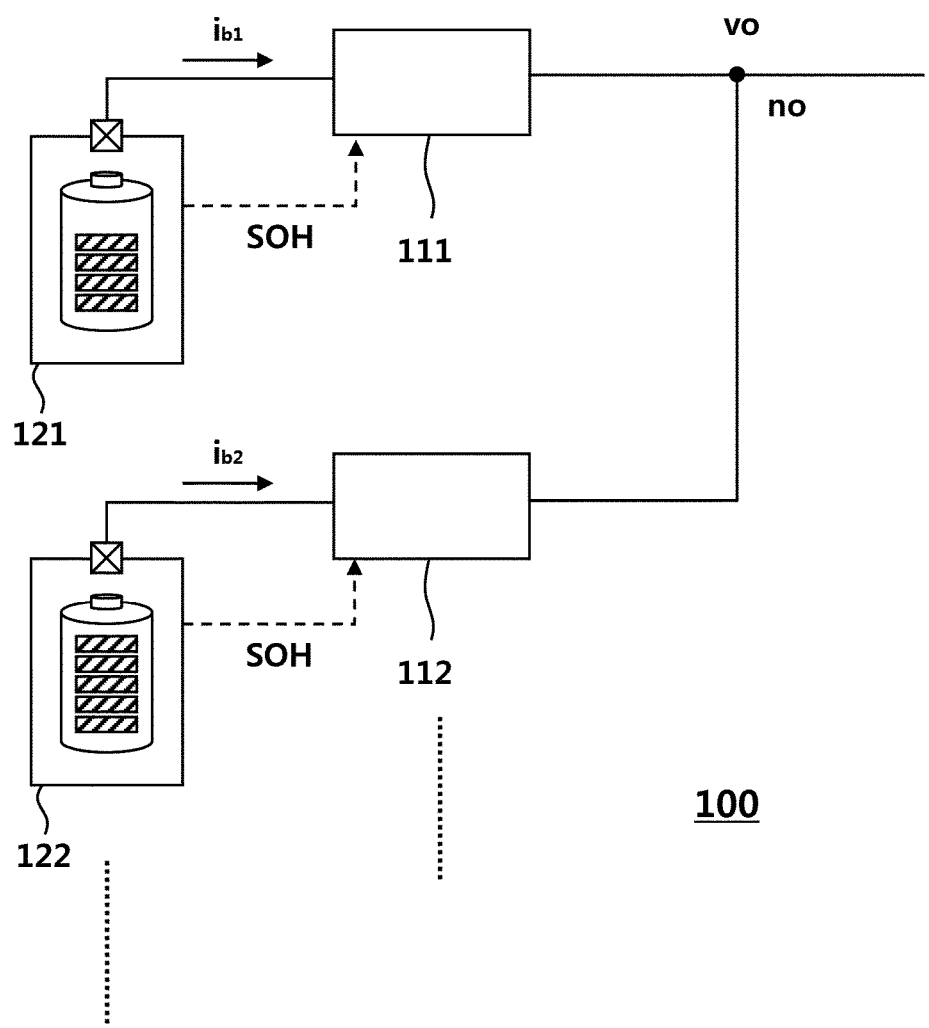

In one exemplary embodiment, as illustrated in FIG. 2, the first charging and discharging control apparatus 111 may adjust the first characteristic value using the first SOH information as the first state information.

Specifically, the first charging and discharging control apparatus 111 may calculate the first y-intercept adjustment value by putting the first SOH information into the independent variable in the first y-intercept value adjustment function.

Figure 13:
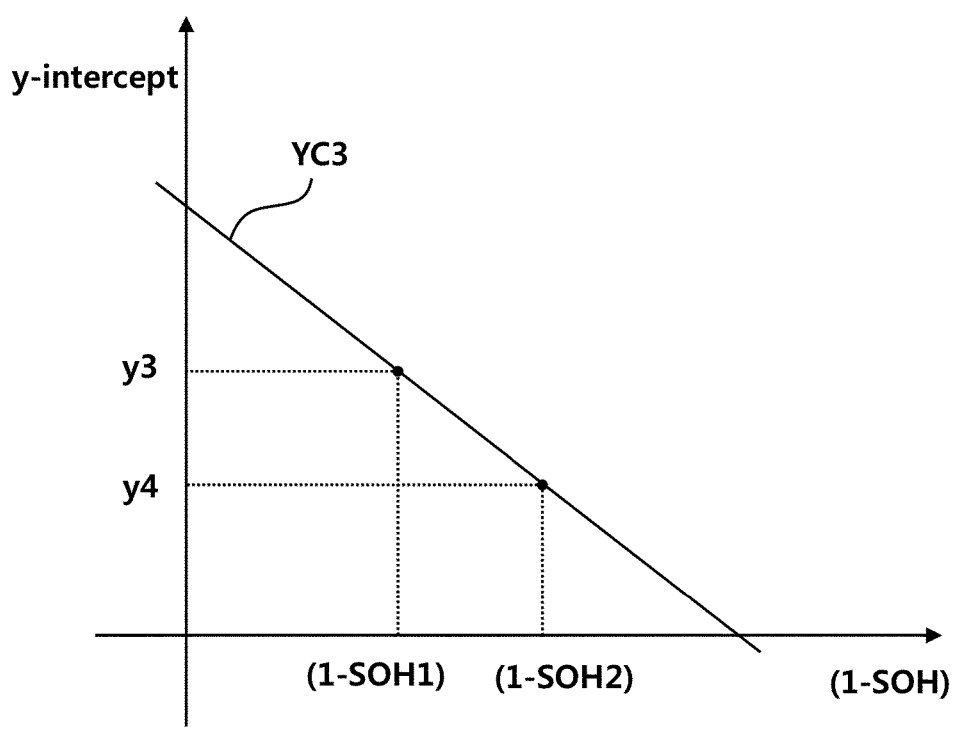

Here, the first y-intercept value adjustment function may be a linear function represented by a linear curve YC3 having a negative slope value as illustrated in FIG. 13.

The first charging and discharging control apparatus 111 may calculate the first y-intercept adjustment value using a value of a constant of 1 minus the first SOH information as an independent variable in the first y-intercept value adjustment function that is the linear function.

When the first y-intercept value adjustment function is the linear function, the first SOH information and the first y-intercept adjustment value may be proportional to each other.

For example, when the first SOH information is SOH1, the first y-intercept adjustment value may be calculated to be y3; and when the first SOH information is SOH2 smaller than SOH1, the first y-intercept adjustment value may be calculated to be y4 smaller than y3.

Figure 3:
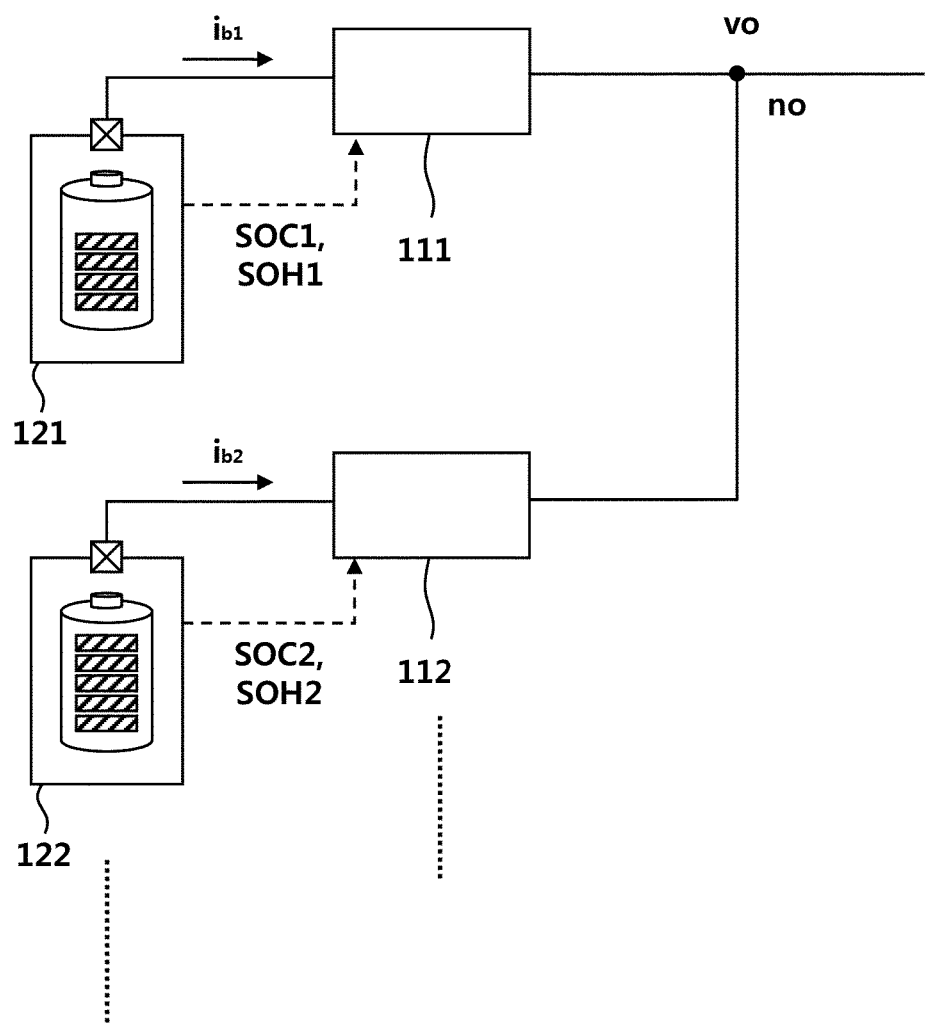

In one exemplary embodiment, as illustrated in FIG. 3, the first charging and discharging control apparatus 111 may use the first SOC information and the first SOH information as the first state information. Here, the first charging and discharging control apparatus 111 may calculate the slope value of the first y-intercept value adjustment function using the first SOH information and may input the first SOC information into the first y-intercept value adjustment function.

Specifically, the first charging and discharging control apparatus 111 may further store a slope value calculation function for calculating the slope value of the y-intercept value adjustment function.

The first charging and discharging control apparatus 111 may calculate the slope value of the y-intercept value adjustment function by putting the first SOH information into the slope value calculation function.

Subsequently, the first charging and discharging control apparatus 111 may calculate the first y-intercept adjustment value by putting the slope value and the first SOC information into the y-intercept value adjustment function.

Figure 14:
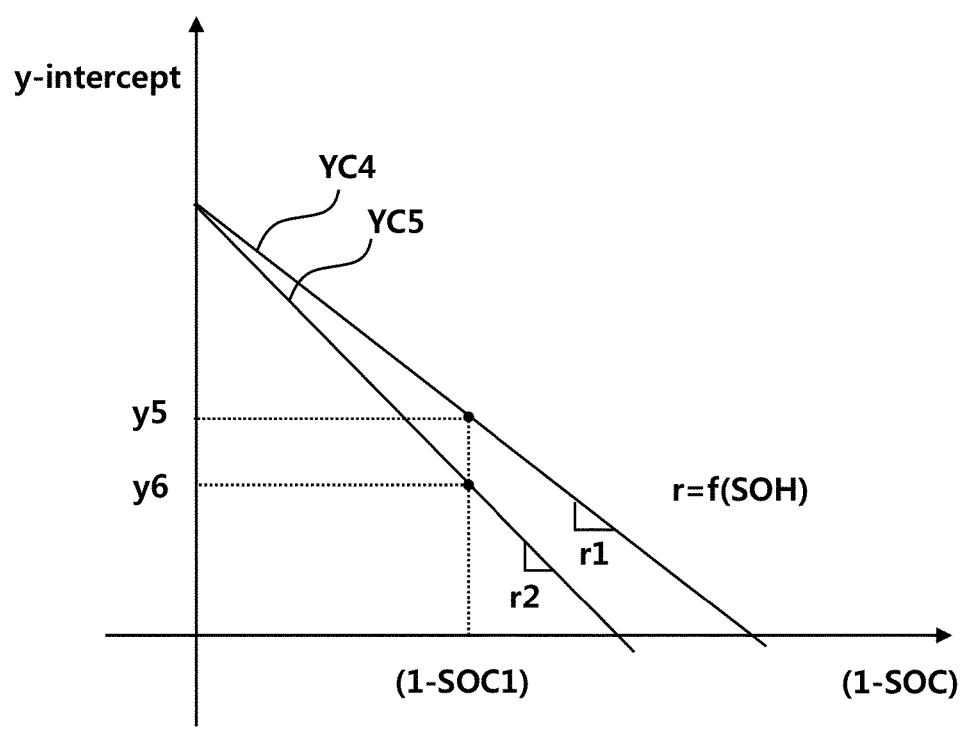

For example, when the first SOH information is SOH1, a slope value r1 may be calculated through the slope value calculation function, and the charging and discharging control apparatus 111 may generate the first y-intercept value adjustment function represented by a linear curve YC4 having a negative slope value of r1 as illustrated in FIG. 14.

The first charging and discharging control apparatus 111 may calculate a first y-intercept adjustment value of y5 using a value of a constant of 1 minus the first SOC information, SOC1, as an independent variable in the first y-intercept value adjustment function.

When the first SOH information is SOH2 smaller than SOH1, a slope value of r2 greater than r1 may be calculated through the slope value calculation function, and the charging and discharging control apparatus 111 may generate the first y-intercept value adjustment function represented by a linear curve YC5 having a negative slope value of r2 as illustrated in FIG. 14.

The first charging and discharging control apparatus 111 may calculate a first y-intercept adjustment value of y6 using a value of a constant of 1 minus SOC1 as an independent variable in the first y-intercept value adjustment function.

As described above, in one exemplary embodiment, the first charging and discharging control apparatus 111 may calculate a different first Y segment adjustment value even when the SOC condition of the first energy storage apparatus 121 is the same and the SOH condition thereof is changed.

In one exemplary embodiment, the first charging and discharging control apparatus 111 may use the first SOC information and the first SOH information as the first state information, in which the first SOC information and the first SOH information may be used as independent variables in the y-intercept value adjustment function.

Figure 15:
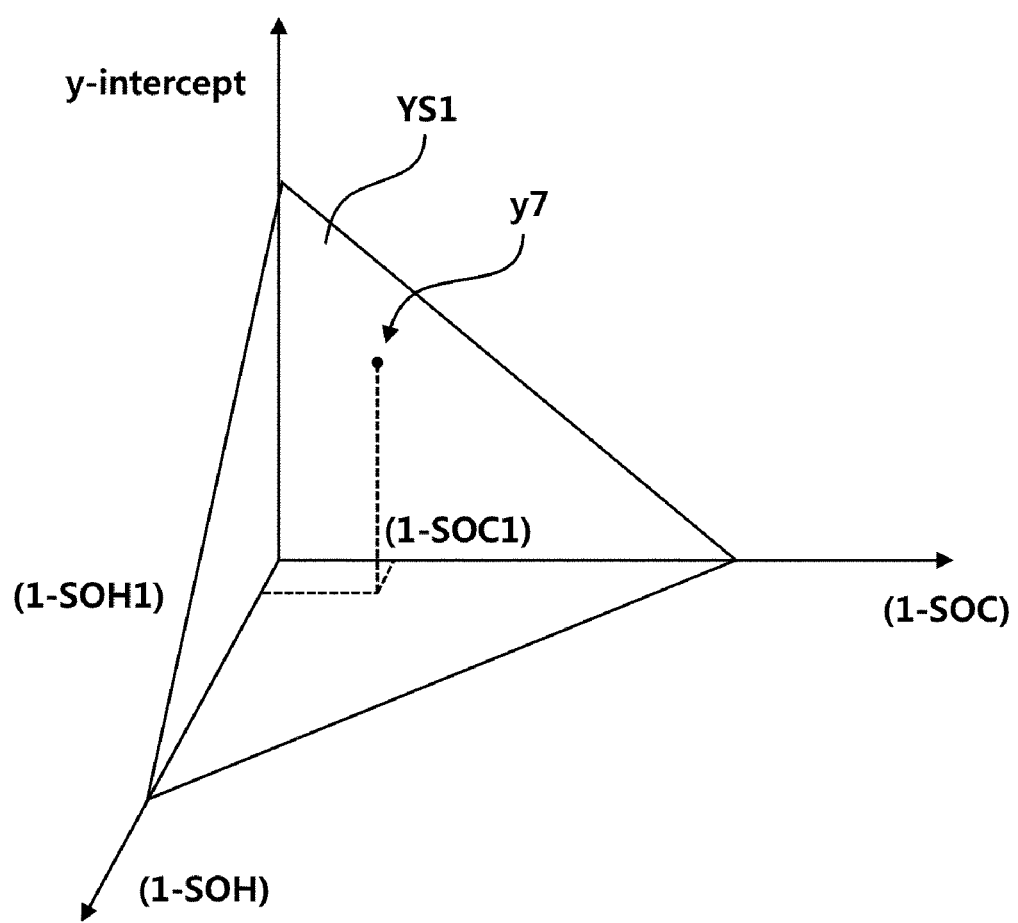

That is, the y-intercept value adjustment function may be a three-dimensional function represented by a three-dimensional space YS1 using the first SOC information as a first independent variable, the first SOH information as a second independent variable, and a y-intercept value as a dependent variable as illustrated in FIG. 15.

The first charging and discharging control apparatus 111 may calculate a first y-intercept adjustment value of y7 using a value of a constant of 1 minus the first SOC information and a value of a constant of 1 minus the first SOH information as a first independent variable and a second independent variable in the first y-intercept value adjustment function.

Figure 4:
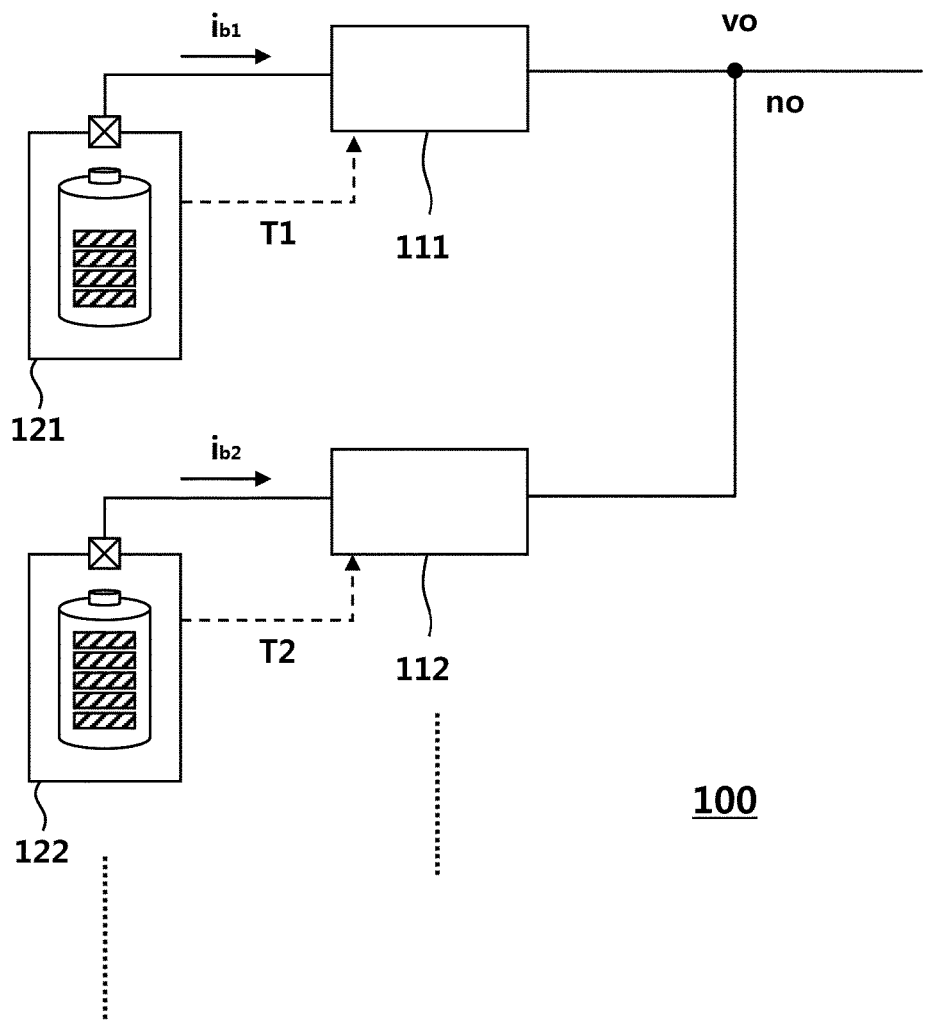

In one exemplary embodiment, as illustrated in FIG. 4, the first charging and discharging control apparatus 111 may adjust the first characteristic value using apparatus temperature information about the first energy storage apparatus 121 as the first state information.

Figure 16:
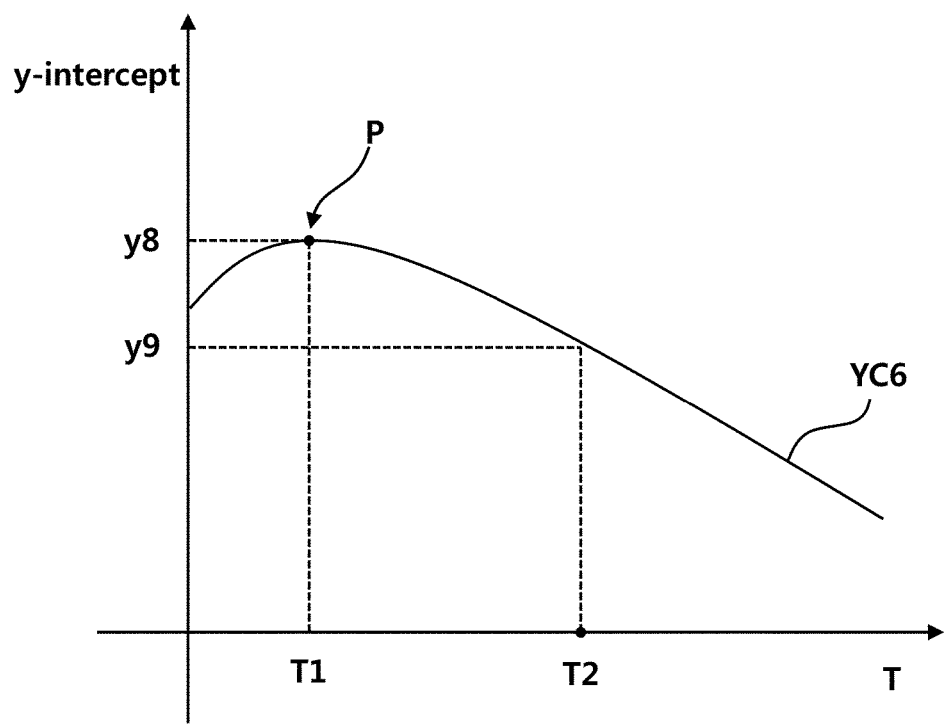

In this case, the first y-intercept value adjustment function may be a nonlinear function represented by a nonlinear curve YC6 that has a predetermined temperature T1 for a peak point P and has the first y-intercept adjustment value maximized when the apparatus temperature information is the predetermined temperature T1 as illustrated in FIG. 16. Here, the predetermined temperature T1 may be an appropriate temperature of the first energy storage apparatus 121.

The first charging and discharging control apparatus 111 may calculate the first Y-intercept adjustment value using the apparatus temperature information as an independent variable in the first Y-intercept value adjustment function that is the nonlinear function illustrated in FIG. 16.

Here, when the apparatus temperature information is a temperature T2 higher than the predetermined temperature T1, a first Y-intercept adjustment value of y9, which smaller than an adjustment value of y8 in the case where the apparatus temperature information is the predetermined temperature, may be calculated.

That is, when the first energy storage apparatus 121 is in a high-temperature state, the first charging and discharging control apparatus 111 may perform droop control of reducing the charging and discharging current amount of the first energy storage apparatus 121 as compared to that in a normal state.

Further, when the first energy storage apparatus 121 is in a low-temperature state, the first charging and discharging control apparatus 111 may also perform droop control of reducing the charging and discharging current amount of the first energy storage apparatus 121 as compared to that in the normal state.

As described above, the first charging and discharging control apparatus 111 may calculate the first y-intercept adjustment value through various first y-intercept value adjustment functions.

In addition, the first charging and discharging control apparatus 111 may store a y-intercept value adjustment lookup table as illustrated in FIG. 17 instead of a first y-intercept value adjustment function and may extract a first y-intercept adjustment value from the y-intercept value adjustment lookup table.

For example, when the first SOC information, which is the first state information, is 0.4, the first charging and discharging control apparatus 111 may extract a y-intercept adjustment value 360V corresponding to an SOC value of 0.4 from the y-intercept value adjustment lookup table.

The second charging and discharging control apparatus 112 is a device that controls the charging and discharging current amount $i_{b2}$ of the second energy storage apparatus 122 according to the output voltage $V_O$ of the output node no.

Figure 9:
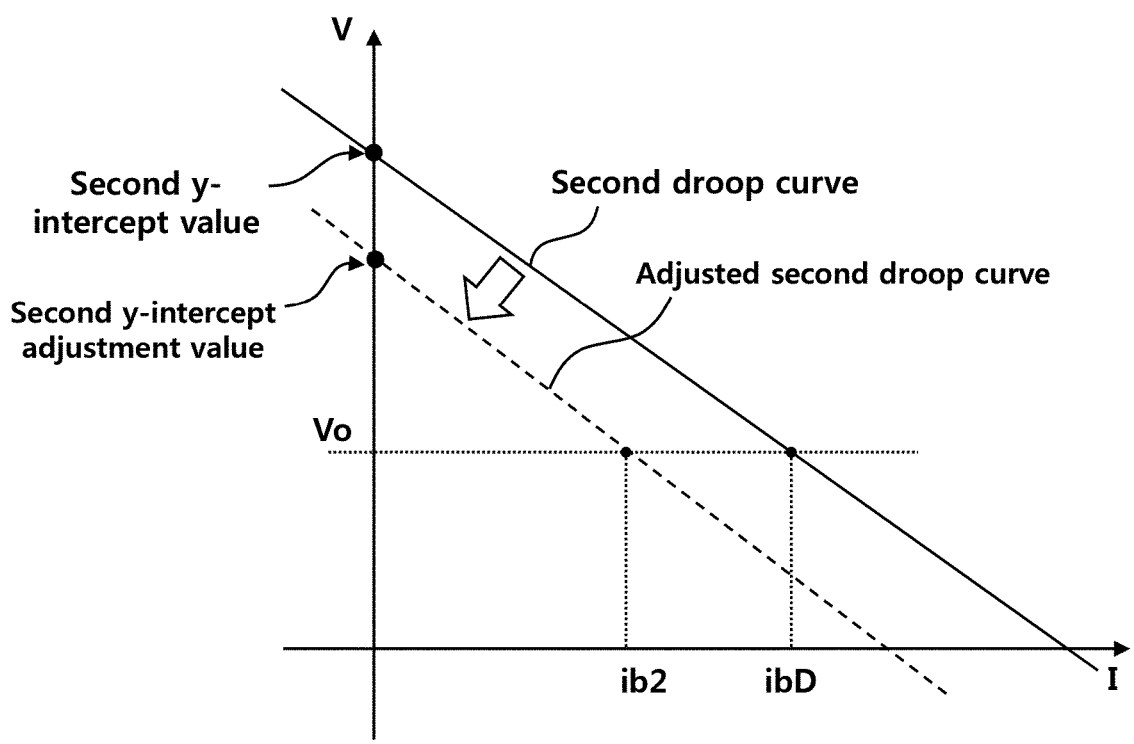

When the charging and discharging performance and the charging and discharging capacity of the second energy storage apparatus 122 are equal or similar to those of the first energy storage apparatus 121, the second charging and discharging control apparatus 112 may adjust a second characteristic value in the same manner as the first charging and discharging control apparatus 111, that is, may calculate a second y-intercept adjustment value according to the state of the second energy storage apparatus 122, and may adjust a second droop curve according to the second y-intercept adjustment value as illustrated in FIG. 9.

Accordingly, the second charging and discharging control apparatus 112 may change the charging and discharging current amount of the second energy storage apparatus 122 from $i_{bD}$ to $i_{b2}$ according to the state of the second energy storage apparatus 122.

Figure 10:
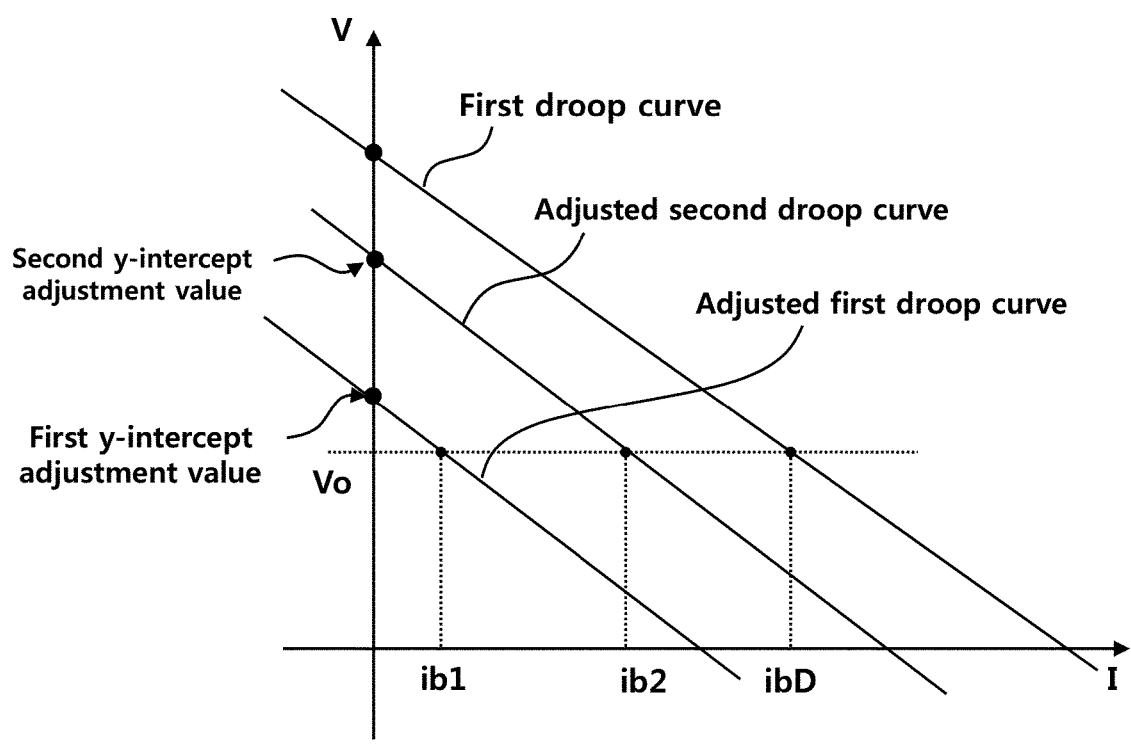
FIG. 10 illustrates a droop curve with a characteristic value differently adjusted depending on the state of each energy storage apparatus according to an exemplary embodiment.

Through the above configurations, the first charging and discharging control apparatus 111 and the second charging and discharging control apparatus 112 may respectively control the charging and discharging current amount $i_{b1}$ of the first energy storage apparatus 121 and the charging and discharging current amount $i_{b2}$ of the second energy storage apparatus 122 using the first droop curve with the first characteristic value adjusted using the first y-intercept adjustment value and the second droop curve with the second characteristic value adjusted using the second y-intercept adjustment value, illustrated in FIG. 10, according to the state of the first energy storage apparatus 121 and the state of the second energy storage apparatus 122.

Accordingly, the first energy storage apparatus 121 and the second energy storage apparatus 122 can appropriately share the charging and discharging current amount in parallel operations as illustrated in FIG. 1 to FIG. 4 according to the state of each thereof.

Figure 18:
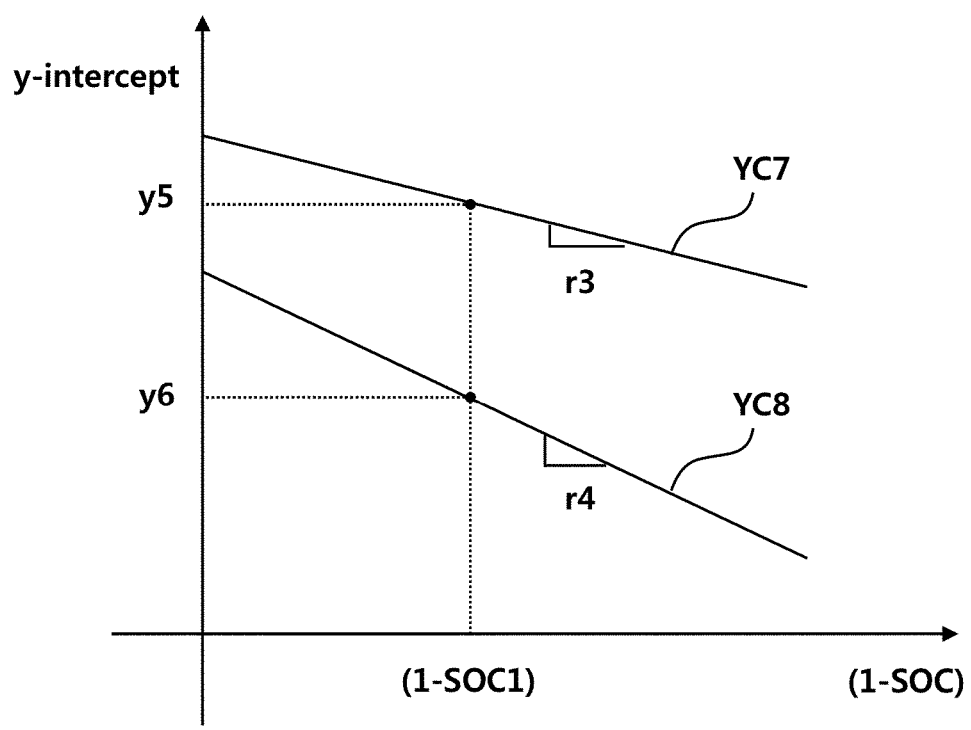
FIG. 18 illustrates a y-intercept value adjustment function for energy storage apparatuses having different charging and discharging capacities according to an exemplary embodiment.

When the first charging and discharging capacity of the first energy storage apparatus 121 and the second charging and discharging capacity of the second energy storage apparatus 122 are different, the slope value of the first y-intercept value adjustment function stored in the first charging and discharging control apparatus 111 and the slope value of the second y-intercept value adjustment function stored in the second charging and discharging control apparatus 112 may be different as illustrated in FIG. 18. Further, variables in the functions other than the slope values may be different.

For example, when the first charging and discharging capacity is greater than the second charging and discharging capacity, the slope value r3 of the first y-intercept value adjustment function corresponding to an upper linear curve YC7 in FIG. 18 may be smaller than the slope value r4 of the second y-intercept value adjustment function corresponding to a lower linear curve YC8.

On the contrary, when the first charging and discharging capacity is less than the second charging and discharging capacity, the slope value r3 of the first y-intercept value adjustment function may be greater than the slope value r4 of the second y-intercept value adjustment function.

As described above, in one exemplary embodiment, since the slope value of a y-intercept value adjustment function may be set differently according to the charging and discharging capacity of an energy storage apparatus, even when the first SOC information of the first energy storage apparatus 121 and the second SOC information of the second energy storage apparatus 122 are the same, different y-intercept adjustment values may be calculated according to the charging and discharging capacities of the energy storage apparatuses as illustrated in FIG. 18.

The first energy storage apparatus 121 includes a first battery cell group having a first charging and discharging capacity, measures first state information, which is state information about the charging and discharging state of the first battery cell group, and transmits the first state information to the first charging and discharging control apparatus 111.

Here, the first battery cell group may include a plurality of battery cells, and the first state information may include one or more of the first SOC information, which is the SOC information about the first energy storage apparatus 121, the first SOH information, which is the SOH information about the first energy storage apparatus 121, and the first apparatus temperature information, which is the internal temperature information about the first energy storage apparatus 121.

The second energy storage apparatus 122 includes a second battery cell group having a second charging and discharging capacity, measures second state information, which is state information about the charging and discharging state of the second battery cell group, and transmits the second state information to the second charging and discharging control apparatus 112.

Here, the second battery cell group may include a plurality of battery cells, and the second state information may include one or more of second SOC information, which is SOC information about the second energy storage apparatus 122, second SOH information, which is SOH information about the second energy storage apparatus 122, and second apparatus temperature information, which is internal temperature information about the second energy storage apparatus 122.

As described above, in one exemplary embodiment, a charging and discharging control apparatus may adjust a characteristic value of a droop curve in view of the current state of an energy storage apparatus and may perform droop control for the charging and discharging current amount accordingly, making it possible to appropriately share the charging and discharging current amount in parallel operations of a plurality of energy storage apparatuses according to the states of the energy storage apparatuses.

Hereinafter, a detailed configuration of a charging and discharging control apparatus according to an exemplary embodiment will be described.

Figure 5:
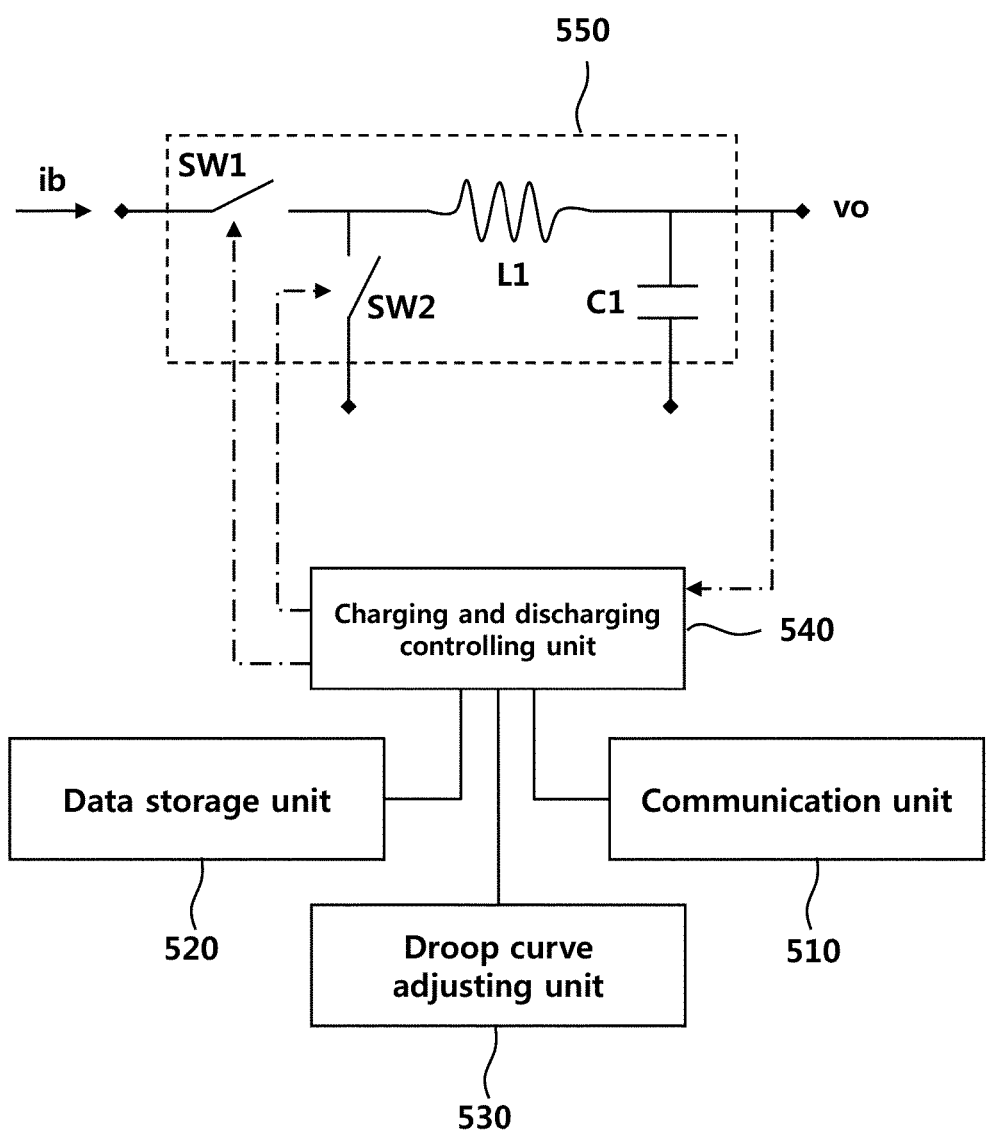
FIG. 5 is a block diagram illustrating a charging and discharging control apparatus according to an exemplary embodiment.

FIG. 5 is a block diagram illustrating a charging and discharging control apparatus according to an exemplary embodiment.

Referring to FIG. 5, the charging and discharging control apparatus 110 may include a communication unit 510, a data storage unit 520, a droop curve adjusting unit 530, a charging and discharging controlling unit 540, and a power unit 550. Here, the charging and discharging control apparatus 110 may be any one of the first charging and discharging control apparatus 111 and the second charging and discharging control apparatus 112.

The communication unit 510 receives state information from an energy storage apparatus. Here, the energy storage apparatus may be any one of the first energy storage apparatus 121 and the second energy storage apparatus 122 illustrated in FIG. 1 to FIG. 4, and the state information may include one or more of SOC information about the energy storage apparatus, SOH information thereabout, and apparatus temperature information thereabout, which is internal temperature information about the energy storage apparatus.

The data storage unit 520 stores a program for performing a function of the charging and discharging control apparatus 110 and stores data necessary for the operation of the charging and discharging control apparatus 110.

In one exemplary embodiment, the data storage unit 520 may store a droop curve having a predetermined characteristic value. Here, the characteristic value may be the y-intercept value of a droop function expressing the droop curve in an equation.

The droop curve and the characteristic value may be default set values stored in the charging and discharging control apparatus 110 when the charging and discharging control apparatus 110 is manufactured. That is, the y-intercept value, an independent variable, and a slope value included in the droop function may be default values set at the time of manufacturing the charging and discharging control apparatus 110.

The data storage unit 520 may further store a y-intercept value adjustment function using a y-intercept adjustment value as a dependent variable. Here, the y-intercept adjustment value may refer to an adjusted value of the first y-intercept value, which is the characteristic value of the droop curve, according to the state of the energy storage apparatus.

The data storage unit 520 may further store a slope value calculation function for calculating the slope value of the y-intercept value adjustment function.

The data storage unit 520 may also store a y-intercept value adjustment lookup table as illustrated in FIG. 17.

In one exemplary embodiment, as illustrated in FIG. 12, the y-intercept value adjustment function may be a nonlinear function that has a gentle slope of a tangent in an x-axis range where the SOC information about the energy storage apparatus is a predetermined threshold or above and has a sharp slope of a tangent in an x-axis range where the SOC information is below the predetermined threshold.

Further, the y-intercept value adjustment function may be a three-dimensional function using the SOC information and the SOH information of the energy storage apparatus as independent variables as illustrated in FIG. 15.

In addition, the y-intercept value adjustment function may be a nonlinear function that has a predetermined temperature for a peak point and has the y-intercept adjustment value maximized when the apparatus temperature information is the predetermined temperature as illustrated in FIG. 16.

The droop curve adjusting unit 530 adjusts the characteristic value of the droop curve according to the state information about the energy storage apparatus.

Specifically, the droop curve adjusting unit 530 may calculate the y-intercept adjustment value by putting the state information into an independent variable in the y-intercept value adjustment function and may adjust the droop curve according to the y-intercept adjustment value in order to adjust the y-intercept value that is the characteristic value of the droop function corresponding to the droop curve.

When the data storage unit 520 further stores the slope value calculation function and the information received by the communication unit 510 includes the SOC information and the SOH information of the energy storage apparatus, the droop curve adjusting unit 530 may calculate the slope value of the y-intercept value adjustment function by putting the SOH information into the slope value calculation function.

Subsequently, the droop curve adjusting unit 530 may adjust the characteristic value by putting the slope value and the SOC information into the y-intercept value adjustment function.

That is, the droop curve adjusting unit 530 may calculate the y-intercept adjustment value, which is the dependent variable, by putting the slope value and the SOC information into the y-intercept value adjustment function, and may change the y-intercept value, which is the existing characteristic value, to the y-intercept adjustment value in the droop function.

When the data storage unit 520 stores the y-intercept value adjustment lookup table, the droop curve adjusting unit 530 may extract a y-intercept adjustment value corresponding to the state information (e.g., the SOC information) from the y-intercept value adjustment lookup table as illustrated in FIG. 17 and may change the y-intercept value, which is the existing characteristic value, to the y-intercept adjustment value.

The charging and discharging controlling unit 540 controls the charging and discharging current amount of the energy storage apparatus according to the droop curve.

That is, the charging and discharging controlling unit 540 may control the charging and discharging current amount $i_b$ of the energy storage apparatus according to the droop curve having the characteristic value adjusted by the droop curve adjusting unit 530 as the y-intercept value.

Here, the charging and discharging controlling unit 540 controls a first switch SW1 and a second switch SW2 of the power unit 550 to be turned on/off according to the output voltage $V_O$, thereby controlling the charging and discharging current amount of the energy storage apparatus. The power unit 550 may be a DC/DC converter including the first switch SW1, the second switch SW2, an inductor L1, and a capacitor C1.

Hereinafter, a process in which the charging and discharging control apparatus 110 controls the charging and discharging current amount of the energy storage apparatus will be described.

Figure 6:
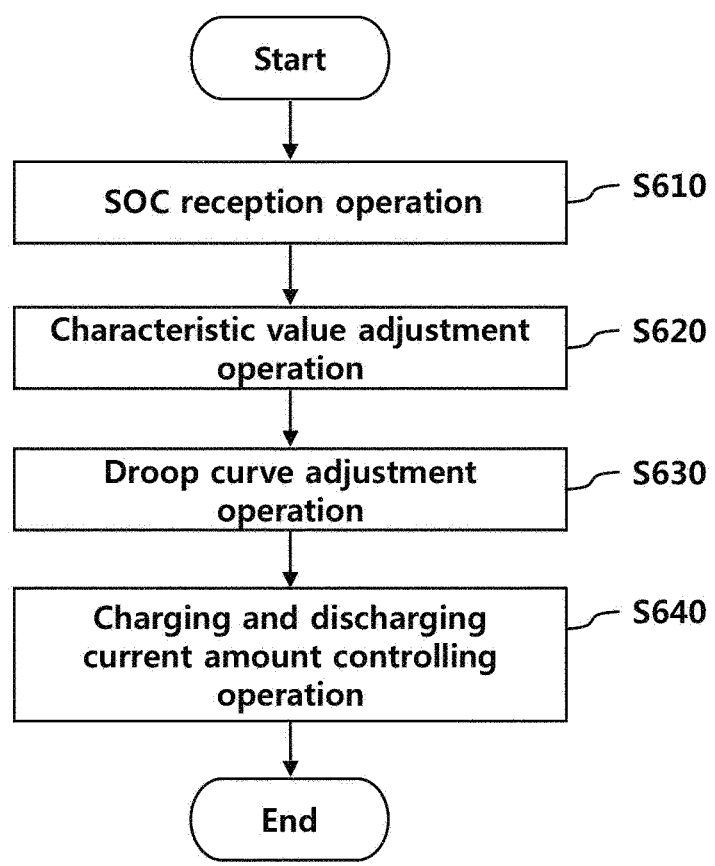
FIG. 6 is a flowchart illustrating a process in which a charging and discharging control apparatus performs droop control according to SOC information about an energy storage apparatus according to an exemplary embodiment.

FIG. 6 is a flowchart illustrating a process in which a charging and discharging control apparatus performs droop control according to SOC information about an energy storage apparatus according to an exemplary embodiment.

Referring to FIG. 6, the charging and discharging control apparatus 110 receives SOC information, which is state information, from the energy storage apparatus (S610).

The charging and discharging control apparatus 110 adjusts a characteristic value of a pre-stored droop curve using the SOC information of the energy storage apparatus (S620). Here, the characteristic value may be the y-intercept value of a droop function expressing the droop curve in an equation. The charging and discharging control apparatus 110 may store a y-intercept value adjustment function using a y-intercept adjustment value, which is an adjusted value of the y-intercept value as the characteristic value, as a dependent variable and may calculate the y-intercept adjustment value by putting the SOC information into an independent variable in the y-intercept value adjustment function.

The charging and discharging control apparatus 110 adjusts the characteristic value to the y-intercept adjustment value, adjusts the existing droop curve according to the adjusted characteristic value, and controls the charging and discharging current amount of the energy storage apparatus using the droop curve (S630 and S640).

Figure 7:
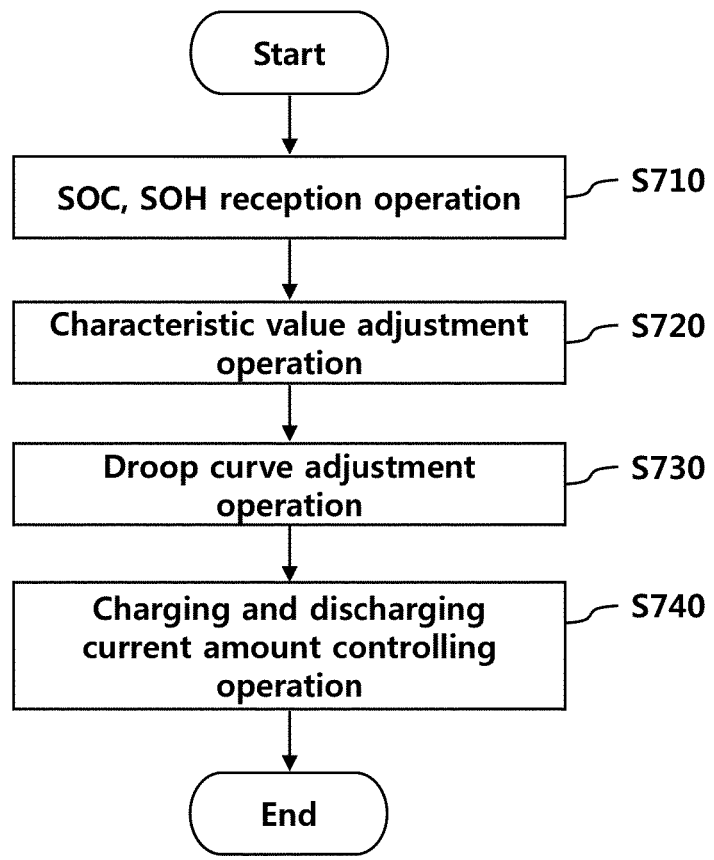
FIG. 7 is a flowchart illustrating a process in which a charging and discharging control apparatus performs droop control according to SOC information and SOH information about an energy storage apparatus according to an exemplary embodiment.

FIG. 7 is a flowchart illustrating a process in which a charging and discharging control apparatus performs droop control according to SOC information and SOH information about an energy storage apparatus according to an exemplary embodiment.

Referring to FIG. 7, the charging and discharging control apparatus 110 receives SOC information and SOH information, which are state information, from the energy storage apparatus (S710).

The charging and discharging control apparatus 110 adjusts a characteristic value of a pre-stored droop curve using the SOC information and the SOH information of the energy storage apparatus (S720). Here, the characteristic value may be the y-intercept value of a droop function expressing the droop curve in an equation. The charging and discharging control apparatus 110 may store a y-intercept value adjustment function using a y-intercept adjustment value, which is an adjusted value of the y-intercept value as the characteristic value, as a dependent variable and may calculate the y-intercept adjustment value by putting the SOC information and the SOH information into an independent variable in the y-intercept value adjustment function.

The charging and discharging control apparatus 110 adjusts the characteristic value, adjusts the existing droop curve according to the adjusted characteristic value, and controls the charging and discharging current amount of the energy storage apparatus using the droop curve (S730 and S740).

As described above, since the charging and discharging control apparatus 110 can adjust the characteristic value of the droop curve for controlling the charging and discharging current amount of the energy storage apparatus according to the charging state (SOC information) and the aging state (SOH information) of the energy storage apparatus, making it possible to appropriately share the charging and discharging current amount in parallel operations of a plurality of energy storage apparatuses according to the states of the energy storage apparatuses.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A charging and discharging control apparatus for an energy storage apparatus, the charging and discharging control apparatus comprising:
    a charging and discharging controlling unit configured to control a charging and discharging current amount of the energy storage apparatus according to a droop curve;
    a communication unit configured to receive state information from the energy storage apparatus; and
    a droop curve adjusting unit configured to adjust a characteristic value of the droop curve according to the state information,
    wherein the characteristic value is a y-intercept value of a droop function expressing the droop curve in an equation, and the droop curve adjusting unit adjusts the characteristic value with a value obtained by putting the state information of the energy storage apparatus into a y-intercept value adjustment function, in which the state information of the energy storage apparatus is used as an independent variable and a y-intercept adjustment value is used as a dependent variable.

2. The charging and discharging control apparatus of claim 1, wherein the state information comprises one or more of state-of-charging (SOC) information, state-of-health (SOH) information, and apparatus temperature information of the energy storage apparatus.

3. The charging and discharging control apparatus of claim 2, wherein the droop curve adjusting unit calculates a slope value of the y-intercept value adjustment function by putting the SOH information into a slope value calculation function for calculating the slope value and adjusts the characteristic value by putting the slope value and the SOC information into the y-intercept value adjustment function.

4. The charging and discharging control apparatus of claim 1, wherein the state information comprises SOC information of the energy storage apparatus, and the y-intercept value adjustment function is a nonlinear function that has a gentle slope of a tangent in an x-axis range where the SOC information is a predetermined threshold or above and has a sharp slope of a tangent in an x-axis range where the SOC information is the predetermined threshold or below.

5. The charging and discharging control apparatus of claim 1, wherein the state information comprises SOC information and SOH information of the energy storage apparatus, and the y-intercept value adjustment function is a three-dimensional function using the SOC information and the SOH information as independent variables.

6. The charging and discharging control apparatus of claim 1, wherein the state information comprises apparatus temperature information of the energy storage apparatus, and the y-intercept value adjustment function is a nonlinear function that sets a predetermined temperature as a peak point and has the y-intercept adjustment value maximized when the apparatus temperature information is the predetermined temperature.

7. The charging and discharging control apparatus of claim 1, further comprising a data storage unit configured to store the droop curve having the characteristic value.

8. The charging and discharging control apparatus of claim 7, wherein the data storage unit is configured to further store the y-intercept value adjustment function using the y-intercept adjustment value as the dependent variable.

9. The charging and discharging control apparatus of claim 7, wherein the data storage unit is configured to further store a slope value calculation function for calculating a slope value of the y-intercept value adjustment function.

10. A charging and discharging control apparatus for an energy storage apparatus, the charging and discharging control apparatus comprising:
    a charging and discharging controlling unit configured to control a charging and discharging current amount of the energy storage apparatus according to a droop curve;
    a communication unit configured to receive state information from the energy storage apparatus; and
    a droop curve adjusting unit configured to adjust a characteristic value of the droop curve according to the state information,
    wherein the characteristic value is a y-intercept value of a droop function expressing the droop curve in an equation, and the droop curve adjusting unit adjusts the characteristic value to a y-intercept adjustment value corresponding to the state information selected from a y-intercept value adjustment lookup table, wherein the y-intercept adjustment value is an adjusted value of the y-intercept value according to a state of the energy storage apparatus.

11. The charging and discharging control apparatus of claim 10, further comprising a data storage unit configured to store the droop curve having the characteristic value.

12. The charging and discharging control apparatus of claim 11, wherein the data storage unit is configured to further store the y-intercept value adjustment lookup table.

13. A charging and discharging control method for an energy storage apparatus, the charging and discharging control method comprising:
    an information reception operation in which a charging and discharging control apparatus, configured to control a charging and discharging current amount of the energy storage apparatus according to a droop curve, receives one or more of state-of-charging (SOC) information, state-of-health (SOH) information, and apparatus temperature information from the energy storage apparatus;
    a characteristic value adjustment operation of adjusting a characteristic value of the droop curve using one or more of the SOC information, the SOH information, and the apparatus temperature information; and
    a droop control operation of controlling the charging and discharging current amount of the energy storage apparatus according to the droop curve having an adjusted characteristic value,
    wherein the characteristic value is a y-intercept value of a droop function expressing the droop curve in an equation, and
    wherein, in the characteristic value adjustment operation, the charging and discharging control apparatus adjusts the characteristic value with a value obtained by putting the SOC information and the SOH information into a y-intercept value adjustment function, in which the SOC information is used as a first independent variable, the SOH information is used as a second independent variable, and a y-intercept adjustment value is used as a dependent variable, wherein the y-intercept adjustment value is an adjusted value of the y-intercept value according to a state of the energy storage apparatus.

14. An energy charging and discharging control system comprising:
- a first energy storage apparatus, comprising a first battery cell group having a first charging and discharging capacity, configured to measure first state information, which relates to a charging and discharging state of the first battery cell group;
- a first charging and discharging control apparatus, which controls a charging and discharging current amount of the first energy storage apparatus according to a first droop curve, configured to receive the first state information from the first energy storage apparatus and to adjust a first characteristic value, which is a characteristic value of the first droop curve, according to the first state information;
- a second energy storage apparatus, comprising a second battery cell group having a second charging and discharging capacity, configured to measure second state information, which relates to a charging and discharging state of the second battery cell group; and
- a second charging and discharging control apparatus, which controls a charging and discharging current amount of the second energy storage apparatus according to a second droop curve, configured to receive the second state information from the second energy storage apparatus and to adjust a second characteristic value, which is a characteristic value of the second droop curve, according to the second state information, wherein the first characteristic value is a first y-intercept value, which is a y-intercept value of a first droop function expressing the first droop curve in an equation, and the first charging and discharging control apparatus adjusts the first characteristic value with a value obtained by putting the first state information into a first y-intercept value adjustment function, in which the first state information is used as an independent variable and a first y-intercept adjustment value is used as a dependent variable, wherein the first y-intercept adjustment value is an adjusted value of the first y-intercept value according to a state of the first energy storage apparatus, and wherein the second characteristic value is a second y-intercept value, which is a y-intercept value of a second droop function expressing the second droop curve in an equation, and the second charging and discharging control apparatus adjusts the second characteristic value with a value obtained by putting the second state information into a second y-intercept value adjustment function, in which the second state information is used as an independent variable and a second y-intercept adjustment value is used as a dependent variable, wherein the second y-intercept adjustment value is an adjusted value of the second y-intercept value according to a state of the second energy storage apparatus.

15. The energy charging and discharging control system of claim 14, wherein when the first charging and discharging capacity and the second charging and discharging capacity are different, a slope value of the first y-intercept value adjustment function and a slope value of the second y-intercept value adjustment function are different.

16. The energy charging and discharging control system of claim 14, wherein the first battery cell group comprises a plurality of battery cells, and the first state information comprises one or more of first SOC information, first SOH information, and first apparatus temperature information of the first energy storage apparatus, and wherein the second battery cell group comprises a plurality of battery cells, and the second state information comprises one or more of second SOC information, second SOH information, and second apparatus temperature information of the second energy storage apparatus.

* * * * *